(12) United States Patent
Pendergast et al.

(10) Patent No.: US 12,709,413 B2
(45) Date of Patent: Aug. 18, 2026

(54) APPARATUS AND METHODS FOR INSTALLATION OF OPTICAL SOLAR REFLECTORS

(71) Applicant: The Boeing Company, Arlington, VA (US)

(72) Inventors: Ross William Pendergast, Tacoma, WA (US); Christopher John Hottes, Enumclaw, WA (US); Yevgeny Sergey Lutsenko, Lake Tapps, WA (US); Jesse Lee Elliott, Maple Valley, WA (US)

(73) Assignee: The Boeing Company, Arlington, VA (US)

( * ) Notice: Subject to any disclaimer, the term of this patent is extended or adjusted under 35 U.S.C. 154(b) by 49 days.

(21) Appl. No.: 18/982,764

(22) Filed: Dec. 16, 2024

(65) Prior Publication Data

US 2026/0167361 A1 Jun. 18, 2026

(51) Int. Cl.
*B64G 1/58* (2006.01)
*H05K 7/20* (2006.01)

(52) U.S. Cl.
CPC ........... *B64G 1/58* (2013.01); *H05K 7/20418* (2013.01); *H05K 7/20427* (2013.01); *Y10T 428/166* (2015.01); *Y10T 428/26* (2015.01)

(58) Field of Classification Search
CPC .. B64G 1/58; H05K 7/20418; H05K 7/20427; E04C 2/041; B29L 2031/10; Y10T 428/166
See application file for complete search history.

(56) References Cited

U.S. PATENT DOCUMENTS

| | | | | |
|---|---|---|---|---|
| 3,405,025 A * | 10/1968 | Goldman | B32B 27/00 156/247 |
| 3,950,581 A * | 4/1976 | Maurin | E04F 15/041 264/261 |
| 4,124,732 A * | 11/1978 | Leger | B64G 1/58 428/920 |
| 5,541,010 A * | 7/1996 | Tanzilli | C04B 41/009 428/472 |
| 2023/0176257 A1* | 6/2023 | Simeoni | G02B 1/116 |
| 2024/0286768 A1* | 8/2024 | Ramirez | B64G 1/546 |

* cited by examiner

*Primary Examiner* — Michael A Tolin
*Assistant Examiner* — Christopher C Caillouet
(74) *Attorney, Agent, or Firm* — Hanley, Flight & Zimmerman, LLC

(57) ABSTRACT

Apparatus and methods for installation of optical solar reflectors are disclosed. An example method includes coupling a first side of a pressure sensitive adhesive (PSA) substrate to a polyester film; coupling a first side of an optical solar reflector to a second side of the PSA substrate; applying an adhesive material to a surface of a vehicle; coupling a second side of the optical solar reflector to the adhesive material; and after curing of the adhesive material, separating the first side of the optical solar reflector from the second side of the PSA substrate, the second side of the optical solar reflector remaining coupled to the surface of the vehicle via the cured adhesive material.

20 Claims, 3 Drawing Sheets

APPARATUS AND METHODS FOR INSTALLATION OF OPTICAL SOLAR REFLECTORS

FIELD OF THE DISCLOSURE

This disclosure relates generally to space vehicles and, more particularly, to apparatus and methods for installation of optical solar reflectors.

BACKGROUND

Optical solar reflectors are installed on exterior surfaces of a space vehicle to facilitate dissipation of heat generated by components (e.g., a motor) of the space vehicle.

Figure 1:
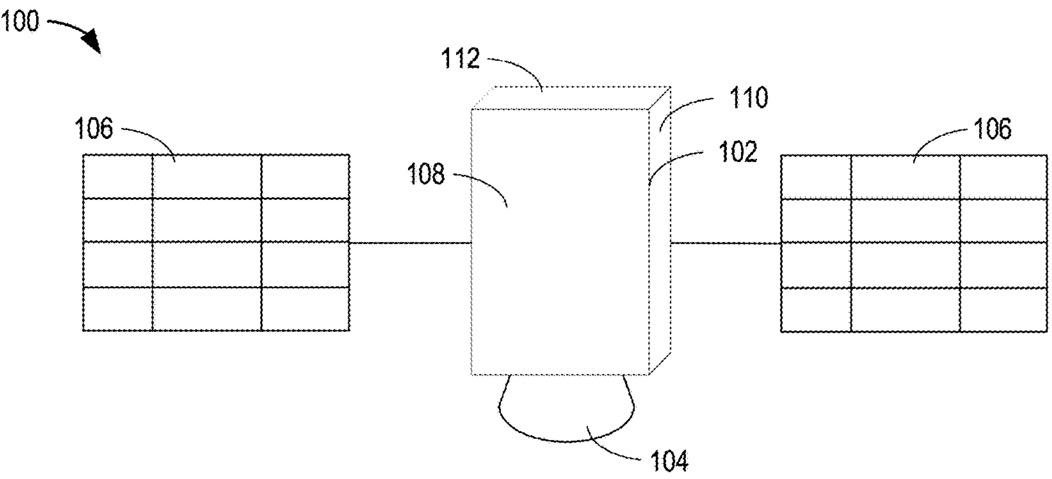
FIG. 1 is a schematic illustration of an example space vehicle in which examples disclosed herein may be implemented.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

DETAILED DESCRIPTION

Optical solar reflectors are installed on exterior surfaces of a space vehicle to facilitate dissipation of heat generated by components (e.g., a motor) of the space vehicle. Known methods for installing optical solar reflectors (OSRs) on a vehicle surface are laborious and time-consuming. For instance, a known method for coupling OSRs to a vehicle surface includes defining the area on the surface where the OSRs are to be located using masks to cover areas where the OSRs are not be applied. An adhesive is applied to the exposed area and the OSRs, which can have an area of one square inch, are individually and manually attached to the surface via the adhesive. However, the adhesive may have a short life before undergoing chemical changes as part of the curing process. Thus, the amount of adhesive that can be applied to the surface of the vehicle during installation of the OSRs is limited so that the OSRs are not attached to adhesive that has been exposed for a period of time and has started to cure. Further, after installation of the OSRs, the cure time for the adhesive can take several days (e.g., seven days). As a result of the limitations on the amount of adhesive that can be applied to the vehicle surface as well as the cure time, the number of OSRs that can be installed at a given time is also limited (e.g., 10-15 OSRs). However, a space vehicle typically includes hundreds of OSRs and, thus, the OSR installation process can take up to 14 days in some instances.

Disclosed herein are example apparatus and methods for installing multiple OSRs on a vehicle surface at once using a template assembly. Examples disclosed herein define a shape template (e.g., a polymer film template) that corresponds to an area of the vehicle surface on which the OSRs are to be installed. A pressure sensitive adhesive (PSA) is coupled to the template. A first side of each OSR that includes a reflective surface (e.g., a mirror) is coupled to PSA. An adhesive material is applied to the vehicle surface. A template assembly including the shape template, the PSA, and the OSRs is coupled to the adhesive on the vehicle surface. In particular, a second, non-reflective side of the respective OSRs attaches to the adhesive material on the vehicle surface. After the adhesive material on the vehicle surface has cured, a portion of the template assembly including the polymer film and the PSA is removed. The OSRs remain coupled to the vehicle surface via the cured adhesive. Thus, when the portion of the template assembly including the polymer film and the PSA is removed, the reflective sides of the OSRs are exposed while the opposing, non-reflective sides of the OSRs are coupled to the adhesive on the vehicle surface.

Examples disclosed herein enable multiple OSRs to be coupled to the vehicle surface at a given time via the template assembly. As a result, the adhesive material can be applied to a larger region of the vehicle surface as compared to known methods in which the amount of adhesive that can be applied is limited to prevent curing of the adhesive before the OSRs are individually attached. As a result, an increased number of OSRs (e.g., 25-75 OSRs) can be coupled to the vehicle surface at a given time. Accordingly, examples disclosed reduce the amount of time to install OSRs on a space vehicle, thereby reducing manufacturing costs and increasing efficiency. Also, the use of the template assembly to couple the OSRs to the vehicle surface reduces manual handling of the OSRs and, thus, reduces risks for damage to the OSRs.

FIG. 1 is a schematic illustration of an example space vehicle 100. In the example of FIG. 1, the space vehicle 100 is a satellite. However, examples disclosed herein can be implemented in connection with other types of space vehicles. The space vehicle 100 includes a housing 102 that supports one or more antennas 104. Solar panels 106 are coupled to the housing 102.

The example space vehicle 100 of FIG. 1 includes a heat-generating components such motors or other power sources. To regulate the vehicle temperature when the space vehicle 100 is in space, one or more surfaces or faces of the housing 102 of the space vehicle 100 can include optical solar reflectors (OSRs) coupled thereto to dissipate heat generated by the components of the space vehicle 100. For example, FIG. 1 shows three surface or faces 108, 110, 112 to which OSRs can be coupled to radiate heat generated by the space vehicle 100 into space. The OSRs can be coupled to other surfaces of the space vehicle 100.

Figure 2:
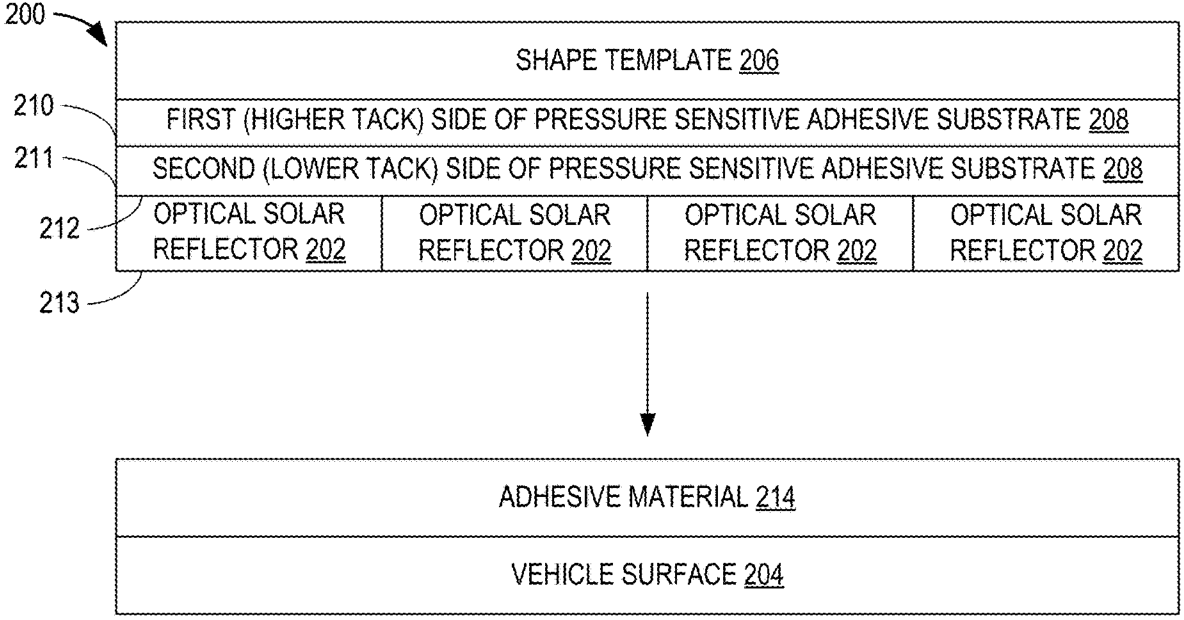
FIG. 2 is a schematic illustration of an optical solar reflector template assembly for coupling optical solar reflectors to a surface of the space vehicle of FIG. 1 in accordance with teachings of this disclosure.

FIG. 2 is a schematic illustration of an optical solar reflector template assembly 200 for coupling optical solar reflectors (OSRs) 202 to a surface 204 of a space vehicle in accordance with teachings of this disclosure. The surface 204 can correspond to one of the faces 108, 110, 112 of the example space vehicle 100 of FIG. 1.

The example OSR template assembly 200 of FIG. 2 includes a shape template 206. The shape template 206 can be defined using a material such as a polyester film (e.g., biaxially oriented polyethylene terephthalate (BoPET), which can be sold, for example, under the name Mylar®; a plastic sheet). For example, the polyester film can be cut into the shape template 206. The shape template 206 can have a shape and size corresponding to at least a portion of the vehicle surface 204 to which the OSRs are to be coupled. As disclosed herein (FIG. 3), the shape template 206 can include features of the vehicle surface 204, such as openings that correspond to locations of fasteners (e.g., bolts) on the vehicle surface 204. The incorporation of vehicle surface features in the shape template 206 facilitates placement (e.g., orientation) of the shape template 206 when the OSR template assembly 200 is coupled to the vehicle surface 204.

The example OSR template assembly 200 of FIG. 2 includes a pressure sensitive adhesive (PSA) substrate 208. As illustrated in FIG. 2, a first side 210 of the PSA substrate 208 is coupled to (e.g., contacts) the shape template 206 such that the first side 210 adheres to the shape template 206. The first side 210 of the PSA substrate 208 has a higher tack property than a tack property of a second side 211 of the PSA substrate 208. Put another way, a strength of an adhesive bond formed between the first side 210 of the PSA substrate 208 and the shape template 206 upon contact is stronger than would be formed upon contact of the second side 211 of the PSA substrate 208 to the shape template 206. In some examples, the PSA substrate 208 is defined by multiple PSA substrates coupled to different portions of the shape template 206.

In the example of FIG. 2, the OSRs 202 are coupled to the second, or lower tack side 211 of the PSA substrate 208. In particular, a first side 212 of each OSR 202 that includes a reflective surface (e.g., a mirror) is coupled to (i.e., contacts, adheres to) the second side 211 of the PSA substrate 208. An opposing second or non-reflective side 213 of each OSR 202 faces away from the PSA substrate 208 and the shape template 206. In some examples, the OSRs 202 can be placed on the second side 211 of the PSA substrate 208 using a vacuum pen, thereby reducing (e.g., minimizing) manual handling of OSRs 202 and, thus, the risk of damage to the OSRs 202 while increasing efficiency in placing the OSRs 202. In some examples, the OSRs are manually placed on the PSA substrate 208. Because the OSRs 202 are coupled to the lower tack side 211 of the PSA substrate 208, the adhesive bond formed between the OSRs 202 and the PSA substrate 208 is of lesser strength than would be formed if the OSRs were coupled to the first side 210 of the PSA substrate 208. As disclosed herein, the coupling of the OSRs to the lower tack side 211 of the PSA substrate 208 facilitates removal of the shape template 206 and PSA substrate 208 from the OSRs 202 when the OSRs 202 are coupled to the vehicle surface 204. The example OSR template assembly 200 can include additional or fewer OSRs 202 than shown in FIG. 2.

In some examples, the shape template 206 can include markings identifying locations at which the OSRs 202 should be placed relative to the shape template 206 (and, thus, the vehicle surface 204). For example, a user can define or mark (e.g., outline, draw, label) the locations of the OSRs 202 on the shape template 206 prior to coupling the PSA substrate 208 to the shape template 206. The locations can be selected to account for, for example, opening(s), edge(s), notch(es), etc. in the shape template 206 that reflect the properties of the vehicle surface 204. The PSA substrate 208 can be a substantially transparent material such that the OSR location markings on the shape template 206 are visible through the PSA substrate 208 after the PSA substrate 208 is coupled to the shape template 206. Thus, the OSRs 202 can be placed on the PSA substrate 208 based on the locations defined by the shape template 206. In some examples, the PSA substrate 208 has a shape and size based on the locations of the markings on the shape template 206. Put another way, in some examples, only portion(s) of the shape template 206 on which the OSRs 302 are to be located is covered by the PSA substrate 208, thereby limiting (e.g., minimizing) excess adhesive on areas of the shape template 206 that do not correspond to locations for the OSRs 202. In some examples, the PSA substrate 208 is defined by one or more PSA substrates that are coupled to the shape template 206 at the OSR marking locations.

In the example of FIG. 2, an adhesive material 214 is applied to the portion of the vehicle surface 204 to which the OSRs 202 are to be coupled. The adhesive material 214 has a tackiness that exceeds the tackiness of the second side 211 of the PSA substrate 208. As disclosed herein, the higher tack level of the adhesive material 214 as compared to lower tack level of the second side 211 of the PSA substrate 208 allows the OSRs 202 to remain coupled to the vehicle surface 204 after removal of the shape template 206. The adhesive material 214 can include, for example, a room temperature vulcanizing (RTV) silicone rubber compound such as RTV 566 A/B and RTV 567.

After application of the adhesive material 214 on the vehicle surface 204, the OSR template assembly 200 (i.e., the assembly including the OSRs 202, the PSA substrate 208, and the shape template 206) is coupled to the vehicle surface 204 via the adhesive material 214. In particular, the second, or non-reflective sides 213 of the OSRs 202 contact the adhesive material such that the OSRs 202 are between the PSA substrate 208 of the OSR template assembly 200 and the adhesive material 214. During placement of OSR template assembly 200 on the vehicle surface 204, the OSR template assembly 200 can be aligned relative to the vehicle surface 204 based on the features of the vehicle surface 204 that are represented by the shape template 206 (e.g., openings for fasteners).

After the OSR template assembly 200 is coupled to the vehicle surface 204, the adhesive material 214 undergoes a curing process. Caul plate(s) and/or weight(s) can be placed on the OSR template assembly 200 (i.e., the side of the OSR template assembly 200 facing away from the vehicle surface 204, namely, the side with the shape template 206). The caul plate(s) and/or weight(s) can help maintain alignment of the OSRs 202, 302 during curing and can be removed after a period of time based on the curing proprieties of the adhesive material 214 (e.g., after 16 hours).

After the adhesive material is fully cured (where the length of curing time depends on the adhesive; e.g., seven days), a portion of the OSR template assembly 200 including the shape template 206 and the PSA substrate 208 is separated or removed (e.g., peeled away) from the first sides 212 of the OSRs 202. In some examples, the portion of the OSR template assembly 200 including the shape template 206 and the PSA substrate 208 is removed by hand (e.g., where removal by hand is facilitated by the low tack nature of the PSA substrate 208). In some examples, a chemical such as isopropyl alcohol can be used to facilitate removal of the portion of the OSR template assembly 200 including the shape template 206 and the PSA substrate 208 from the first sides 212 of the OSRs 202. For example, if an area of the PSA substrate 209 is sticking to the OSRs 202, a small amount of isopropyl alcohol could be applied to help peel off the PSA 208 from the OSRs 202. In the example of FIG. 2, because the tackiness of the adhesive material 214 on the vehicle surface 204 exceeds the tackiness of the second side 211 of the PSA substrate 208, the OSRs 202 remain coupled to the vehicle surface 204 when the portion of the OSR template assembly 200 including the shape template 206 and the PSA substrate 208 is removed. When the portion of the OSR template assembly 200 including the shape template 206 and the PSA substrate 208 is separated from the OSRs 202, the first or reflective sides 212 of the OSRs 202 are exposed (i.e., the first or reflective sides 212 of the OSRs 202 face away from the vehicle surface 204). Also, because tackiness of the first side 210 of the PSA substrate 208 is greater than the second side 211 of the PSA substrate 208, the PSA substrate 208 and the shape template 206 remain together during separation from the OSRs 202, thereby providing for efficient removal of the shape template 206. Thus, in the example of FIG. 2, a plurality of OSRs can be coupled to the vehicle surface 204 at a given time via the OSR template assembly 200.

Figure 3:
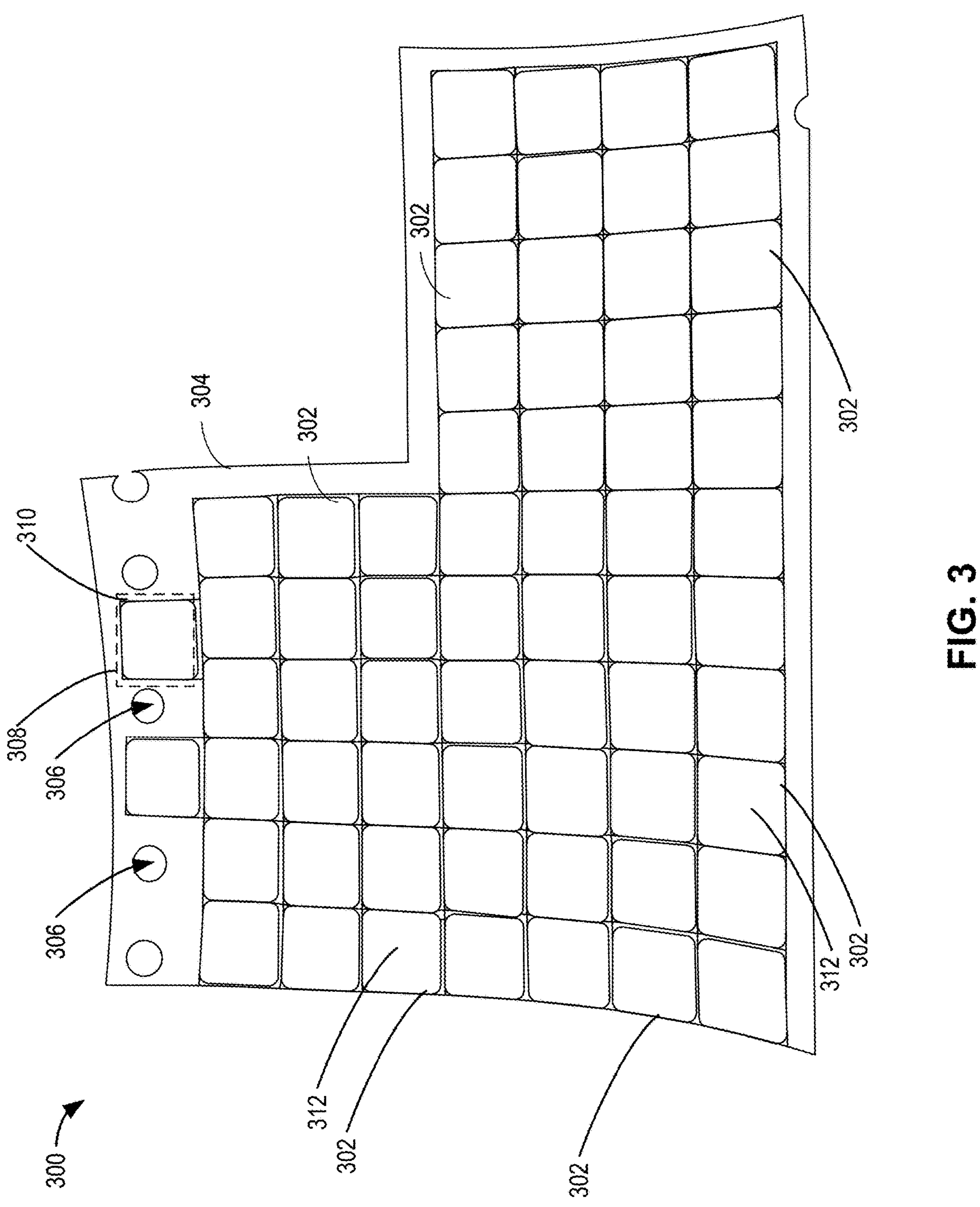
FIG. 3 illustrates an example optical solar reflector template assembly in accordance with teachings of this disclosure.

FIG. 3 illustrates an example optical solar reflector (OSR) template assembly 300 that can be used to couple OSRs 302 to a surface of a vehicle (e.g., faces 108, 110, 112 of the space vehicle 100 of FIG. 1, the surface 204 of FIG. 2). The example OSR template assembly 300 can correspond to the example OSR template assembly 200 of FIG. 2. The OSR template assembly 300 includes a shape template 304, which may be defined by a polymer film. The example shape template 304 has a shape and size corresponding to a portion of a surface of vehicle on which the OSRs 302 are to be installed. For example, the shape template 304 includes openings 306 that correspond to locations of fasteners (e.g., bolts) on the vehicle surface so that the shape template 304 accommodates the presence of the fasteners when placed on the vehicle surface during the process of coupling the OSRs 302 to the vehicle surface. The shape template 304 can have a different shape, size, and/or features (e.g., openings, no openings) than shown in FIG. 3.

In the example of FIG. 3, the OSRs 302 can be placed relative to the shape template 304 based on locations marked, outlined, or otherwise identified on the shape template 304. The dashed box 308 in FIG. 3 represents a marking that can be made on the shape template 304 to identify a location of an OSR 302. As shown in FIG. 3, the location of the marking 308 can be based on the location of the openings 306 in the shape template 304, In the example OSR template assembly 300 of FIG. 3, a PSA substrate 310 (e.g., the PSA substrate 208 of FIG. 2) is coupled to the shape template 304. The OSRs 302 are placed on the higher tack side of the PSA substrate 310. The PSA substrate 310 can be a substantially transparent material such that the marking 308 on the shape template 304 can be seen through the PSA substrate 310. In some examples, the PSA substrate 310 has a shape that is defined based on the OSR location markings (e.g., so that only a portion of the shape template 304 on which the OSRs 302 are to be located is covered by the PSA substrate 310, thereby limiting (e.g., minimizing) excess adhesive on areas of the shape template 304 that do not correspond to locations for the OSRs 302). In some examples, the PSA substrate 310 is defined by two or more PSA substrates, where the PSA substrates are coupled to the shape template 304 based on the OSR marking locations.

As disclosed in connection with FIG. 2, the reflective sides of the OSRs 302 (e.g., the first sides 212 of the OSRs 202 of FIG. 2) are coupled to (e.g., attached to, adhered to) the lower tack side of the PSA substrate 310. Thus, FIG. 3 shows second or non-reflective sides 312 of the OSRs 302. When the example OSR template assembly 300 of FIG. 3 is coupled to the vehicle surface 204, the second or non-reflective sides 312 of the OSRs 302 contact and attach to an adhesive material (e.g., the adhesive material 214 of FIG. 2). After curing of the adhesive material, the portion of the OSR template assembly 300 including the shape template 304 and the PSA substrate 310 are separated from the OSRs 302 that have been adhered to the vehicle surface via the adhesive material. At that time, the reflective sides of the OSRs 302 are exposed.

Figure 4:
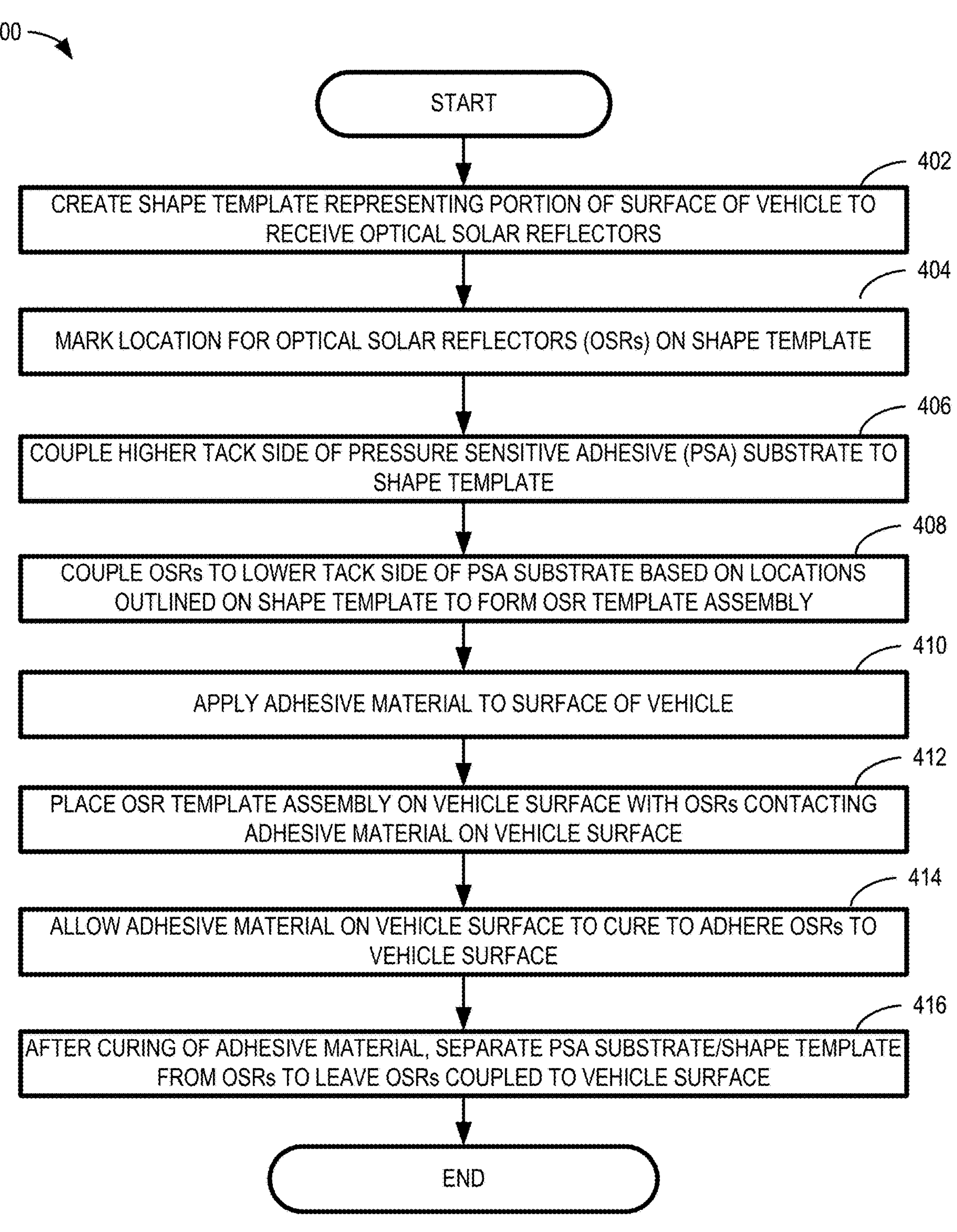
FIG. 4 is a flow chart of an example method for coupling optical solar reflectors to a surface of a space vehicle in accordance with teachings of this disclosure.

FIG. 4 is a flowchart of an example method 400 for coupling optical solar reflectors (e.g., the OSRs 202, 302 of FIGS. 2 and 3) to a surface (e.g., the face(s) 108, 110, 112 of FIG. 1, the surface 204 of FIG. 2) of a vehicle (e.g., the space vehicle 100 of FIG. 1) using an OSR template assembly (e.g., the OSR template assembly 200, 300). At block 402, the example method 400 includes creating a shape template 206, 304 that represents at least a portion of the surface 108, 110, 112, 204 of the vehicle 100 to which the OSRs 202, 302 are to be coupled. For example, the shape template 206, 304 can be formed from a plastic sheet or a polymer film. In some examples, creating the shape template 206, 304 includes defining features of the vehicle surface 108, 110, 112, 204 in the shape template 206, 204, such as openings 306 corresponding to the locations of fasteners protruding from the vehicle surface 108, 110, 112, 204.

At block 404, the example method 400 includes marking locations for the OSRs 202, 302 on the shape template 206, 304. For example, the locations at which the OSRs 202, 302 are to be placed relative to the shape template 206, 306 (and, thus, the vehicle surface 204) can be outlined, drawn, or otherwise labeled on the shape template 206, 304 (e.g., the marking 308 of FIG. 3) to facilitate placement of the OSRs 202, 302.

At block 406, the example method 400 includes coupling a higher tack side 210 of a pressure sensitive adhesive (PSA) substrate 208, 310 to the shape template 206, 304. At block 408, the example method 400 includes coupling the OSRs 202, 302 to a lower tack side 211 of the PSA substrate 208, 310. In the example of FIG. 4, the OSRs 202, 302 are attached to the PSA substrate 310 based on the locations 308 marked on the shape template 206, 204. The OSRs 202, 302 can be placed on the PSA substrate 208, 310 using, for example, a vacuum pen. In the example of FIG. 4, a first or reflective side 212 of each OSR 202, 302 is coupled to, and thus, faces the PSA substrate 208, 310 (i.e., the first sides 212 of the OSRs 202, 302 contact the PSA substrate 208, 310). A second (e.g., non-reflective) side 213, 312 of each OSR 202, 302 faces away from the PSA substrate 208, 310. Thus, at block 408 an OSR template assembly 200, 300 including the shape template 206, 304, the PSA substrate 208, 310, and the OSRs 202, 302 is formed.

At block 410, the example method 400 includes applying an adhesive material 214 to the vehicle surface 204. The adhesive material 214 has a higher tack than the tack of the second side 211 of the PSA substrate 208, 310.

At block 412, the example method 400 includes placing the OSR template assembly 200, 300 on the vehicle surface 204 with the OSRs 202, 302 contacting the adhesive material 214. For example, the second (e.g., non-reflective) sides 213, 312 of the OSRs 202, 302 contacts the adhesive material 214.

At block 414, the example method 400 includes allowing the adhesive material 214 on the vehicle surface 204 to cure. In some examples, the example method 400 includes placing caul plate(s) or weight(s) on the OSR template assembly 200, 300 to help maintain the placement of the OSRs 202, 302 relative to the vehicle surface 204 during curing.

After curing the adhesive material 214 on the vehicle surface 204, the example method 400 includes separating a portion of the OSR template assembly 200, 300 including the PSA substrate 208, 310 and the shape template 206, 304 from the OSRs 202, 302 at block 416. The OSRs 202, 302 remain coupled to the vehicle surface 204 via the adhesive material 214 and the first or reflective sides 212 of the OSRs 202, 302 are exposed (i.e., the sides 212 that face away from the vehicle surface 204). As disclosed herein, because the first sides 212 of the OSRs 202, 302 are coupled to the lower tack side 211 of the PSA substrate 208, 310 and the adhesive material 214 has a higher tack, the OSRs 202, 302 remain coupled to the adhesive material 214 during removal of the portion of the OSR template assembly 200, 300 including the PSA substrate 208, 310 and the shape template 206, 304. The first sides 212 of the OSRs 202, 302 can be cleaned after being exposed (e.g., using isopropyl alcohol to clean residue from the PSA substrate 208, 310 that may remain on the reflective surface(s) of the OSR(s) 202, 302).

Although the example method 400 is described with reference to the flowchart illustrated in FIG. 4, many other methods of coupling OSRs to a vehicle surface using a template may alternatively be used. For example, the order of execution of the blocks may be changed, and/or some of the blocks described may be changed, eliminated, or combined. Similarly, additional operations may be included in the example method of FIG. 4 before, in between, or after the blocks shown in FIG. 4.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities, etc., the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities, etc., the phrase "at least one of A or B" is intended to refer to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly within the context of the discussion (e.g., within a claim) in which the elements might, for example, otherwise share a same name.

From the foregoing, it will be appreciated that example systems, apparatus, articles of manufacture, and methods have been disclosed that provide for efficient coupling of a plurality of optical solar reflectors (OSRs) to a surface of a vehicle. In examples disclosed herein, a template is created based on the features of the portion of the vehicle surface to which the OSRs are to be coupled. The OSRs are coupled to the template to form a template assembly. The template assembly including OSRs is coupled to the vehicle surface via an adhesive applied to the vehicle surface. After curing of the adhesive, a portion of the template is removed and the OSRs remain coupled to the vehicle surface. The template assembly enables a plurality of OSRs to be coupled to the vehicle surface at a given time without comprising the quality of the adhesive on the vehicle surface that may otherwise occur when the OSRs are individually placed on the vehicle surface and the adhesive is exposed over time. Thus, examples disclosed herein provide for increased workflow efficiency and reduces manual handling of the OSRs, thereby reducing damage to the reflectors.

Example apparatus and methods for installation of optical solar reflectors are disclosed. Further examples and combinations thereof include the following:

Example 1 includes a method comprising coupling a first side of a pressure sensitive adhesive (PSA) substrate to a polyester film; coupling a first side of an optical solar reflector to a second side of the PSA substrate; applying an adhesive material to a surface of a vehicle; coupling a second side of the optical solar reflector to the adhesive material; and after curing of the adhesive material, separating the first side of the optical solar reflector from the second side of the PSA substrate, the second side of the optical solar reflector remaining coupled to the surface of the vehicle via the cured adhesive material.

Example 2 includes the method of example 1, further including creating a template from the polyester film, the template having a shape based on the surface of the vehicle, the first side of the PSA substrate coupled to the template.

Example 3 includes the method of examples 1 or 2, further including marking a location for the optical solar reflector on the template.

Example 4 includes the method of any of examples 1-3, further including placing the optical solar reflector on the second side of the PSA substrate using a vacuum pen.

Example 5 includes the method of any of examples 1-4, wherein the first side of the PSA substrate is coupled to a first side of the polyester film and further including placing a caul plate on a second side of the polyester film after coupling the second side of the optical solar reflector to the adhesive material.

Example 6 includes the method of any of examples 1-5, wherein coupling the first side of the PSA substrate to the polyester film includes coupling a side of the PSA substrate having a higher tack property to the polyester film.

Example 7 includes the method of any of examples 1-6, wherein the optical solar reflector is a first optical solar reflector of a plurality of optical solar reflectors coupled to the second side of the PSA substrate and wherein the coupling the second side of the first optical solar reflector occurs during coupling of the plurality of optical solar reflectors to the adhesive material.

Example 8 includes the method of any of examples 1-7, wherein separating the first side of the optical solar reflector from the second side of the PSA substrate includes peeling the PSA substrate including the polyester film away from the first side of the optical solar reflector.

Example 9 includes a method for installing optical solar reflectors on a surface of a space vehicle, the method comprising creating a shape template from a polyester film based on the surface of the space vehicle to which the optical solar reflectors are to be coupled; marking locations for the respective optical solar reflectors on the shape template; coupling a first side of a pressure sensitive adhesive (PSA) substrate to the shape template; coupling first sides of the respective optical solar reflectors to a second side of the PSA substrate based on the locations on the shape template, the shape template, the PSA substrate, and the optical solar reflectors defining a template assembly; coupling the template assembly to the surface of the space vehicle via an adhesive material, the optical solar reflectors between the surface of the space vehicle and PSA substrate, a second side of the respective optical solar reflectors to contact the adhesive material; and after curing the adhesive material, removing a portion of the template assembly including the shape template and the PSA substrate from the first sides of the respective optical solar reflectors.

Example 10 includes the method of example 9, further including using a vacuum pen to couple the first sides of the respective optical solar reflectors to the second side of the PSA substrate.

Example 11 includes the method of examples 9 or 10, wherein coupling the first side of PSA substrate to the shape template includes coupling a side of the PSA substrate having a higher tack to the shape template.

Example 12 includes the method of any of examples 9-11, wherein coupling the first sides of the respective optical solar reflectors to the second side of the PSA substrate includes coupling the respective optical solar reflectors to an opposing side of the PSA substrate having a lower tack.

Example 13 includes the method of any of examples 9-12, further including placing one or more weights on the template assembly during the curing of the adhesive material.

Example 14 includes the method of any of examples 9-13, further including applying the adhesive material over an area of the surface of the space vehicle to which the optical solar reflectors are to be coupled.

Example 15 includes the method of any of examples 9-14, wherein creating the shape template includes defining one or more openings in the polyester film, the one or more openings corresponding to one or more openings on the surface of the space vehicle to receive a bolt.

Example 16 includes the method of any of example 9-15, wherein the locations for the respective optical solar reflectors on the shape template are based on locations of the one or more openings in the polyester film.

Example 17 includes the method of any of examples 9-17, wherein creating the shape template includes cutting the polyester film to have a shape corresponding to an area of the surface of the space vehicle to which the optical solar reflectors are to be coupled.

Example 19 includes a kit comprising a plastic sheet; a pressure sensitive adhesive (PSA) substrate having a first side and a second side, the first side of the PSA substrate to be coupled to the plastic sheet; and a plurality of optical solar reflectors, a first side of each of the optical solar reflectors to be removably coupled to the second side of the PSA substrate.

Example 19 includes the kit of example 18, further including an adhesive substance to be applied to a surface of a vehicle, a second side of each of the optical solar reflectors to be attached to the surface of the vehicle via curing of the adhesive substance.

Example 20 includes the kit of examples 18 or 19, wherein the first side of the PSA substrate has a first tack level and the second side of the PSA substrate has a second tack level, the first tack level greater than the second tack level.

The following claims are hereby incorporated into this Detailed Description by this reference. Although certain example systems, apparatus, articles of manufacture, and methods have been disclosed herein, the scope of coverage of this patent is not limited thereto. On the contrary, this patent covers all systems, apparatus, articles of manufacture, and methods fairly falling within the scope of the claims of this patent.

What is claimed is:

1. A method comprising:

coupling a first side of a pressure sensitive adhesive (PSA) substrate to a polyester film;

coupling respective first sides of optical solar reflectors to a second side of the PSA substrate;

applying an adhesive material to a surface of a vehicle;

coupling respective second sides of the optical solar reflectors to the adhesive material; and after curing of the adhesive material, separating the respective first sides of the optical solar reflectors from the second side of the PSA substrate, the respective second sides of the optical solar reflectors remaining coupled to the surface of the vehicle via the cured adhesive material.

2. The method of claim 1, further including creating a template from the polyester film, the template having a shape based on the surface of the vehicle, the first side of the PSA substrate coupled to the template.

3. The method of claim 2, further including marking a location for the optical solar reflectors on the template.

4. The method of claim 2, further including defining one or more openings in the template, the one or more openings corresponding to locations of fasteners on the surface of the vehicle.

5. The method of claim 1, further including placing the optical solar reflectors on the second side of the PSA substrate using a vacuum pen.

6. The method of claim 1, wherein the first side of the PSA substrate is coupled to a first side of the polyester film and further including placing a caul plate on a second side of the polyester film after coupling the respective second sides of the optical solar reflectors to the adhesive material.

7. The method of claim 1, wherein coupling the first side of the PSA substrate to the polyester film includes coupling a side of the PSA substrate having a higher tack property than the respective first sides of the optical solar reflectors to the polyester film.

8. The method of claim 1, wherein separating the respective first sides of the optical solar reflectors from the second side of the PSA substrate includes peeling the PSA substrate including the polyester film away from the respective first sides of the optical solar reflectors.

9. A method for installing optical solar reflectors on a surface of a space vehicle, the method comprising:

creating a shape template from a polyester film based on the surface of the space vehicle to which the optical solar reflectors are to be coupled;

marking locations for the respective optical solar reflectors on the shape template;

coupling a first side of a pressure sensitive adhesive (PSA) substrate to the shape template;

coupling first sides of the respective optical solar reflectors to a second side of the PSA substrate based on the locations on the shape template, the shape template, the PSA substrate, and the optical solar reflectors defining a template assembly;

coupling the template assembly to the surface of the space vehicle via an adhesive material, the optical solar reflectors between the surface of the space vehicle and PSA substrate, a second side of the respective optical solar reflectors to contact the adhesive material; and after curing the adhesive material, removing a portion of the template assembly including the shape template and the PSA substrate from the first sides of the respective optical solar reflectors.

10. The method of claim 9, further including using a vacuum pen to couple the first sides of the respective optical solar reflectors to the second side of the PSA substrate.

11. The method of claim 9, wherein coupling the first side of PSA substrate to the shape template includes coupling a side of the PSA substrate having a higher tack than the first sides of the respective optical solar reflectors to the shape template.

12. The method of claim 11, wherein coupling the first sides of the respective optical solar reflectors to the second side of the PSA substrate includes coupling the respective optical solar reflectors to an opposing side of the PSA substrate having a lower tack.

13. The method of claim 9, further including placing one or more weights on the template assembly during the curing of the adhesive material.

14. The method of claim 9, further including applying the adhesive material over an area of the surface of the space vehicle to which the optical solar reflectors are to be coupled.

15. The method of claim 9, wherein creating the shape template includes defining one or more openings in the polyester film, the one or more openings corresponding to one or more openings on the surface of the space vehicle to receive a bolt.

16. The method of claim 15, wherein the locations for the respective optical solar reflectors on the shape template are based on locations of the one or more openings in the polyester film.

17. The method of claim 9, wherein creating the shape template includes cutting the polyester film to have a shape corresponding to an area of the surface of the space vehicle to which the optical solar reflectors are to be coupled.

18. A kit comprising:

a plastic sheet;

a pressure sensitive adhesive (PSA) substrate having a first side and a second side, the first side of the PSA substrate to be coupled to the plastic sheet; and a plurality of optical solar reflectors, a first side of each of the optical solar reflectors to be removably coupled to the second side of the PSA substrate, wherein an adhesive strength between the first side of the PSA substrate and the plastic sheet is stronger than an adhesive strength between the second side of the PSA substrate and the first side of each of the optical reflectors.

19. The kit of claim 18, further including an adhesive substance to be applied to a surface of a vehicle, a second side of each of the optical solar reflectors to be attached to the surface of the vehicle via curing of the adhesive substance.

20. The kit of claim 18, wherein the first side of the PSA substrate has a first tack level and the second side of the PSA substrate has a second tack level, the first tack level greater than the second tack level.

* * * * *